United States Patent
Yanagi et al.

(10) Patent No.: US 7,205,250 B2
(45) Date of Patent: Apr. 17, 2007

(54) PLASMA PROCESSING METHOD AND APPARATUS

(75) Inventors: Yoshihiro Yanagi, Neyagawa (JP); Ichiro Nakayama, Kadoma (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 23 days.

(21) Appl. No.: 10/801,551

(22) Filed: Mar. 17, 2004

(65) Prior Publication Data
US 2005/0037629 A1 Feb. 17, 2005

(30) Foreign Application Priority Data
Mar. 18, 2003 (JP) .............................. 2003-073861

(51) Int. Cl.
*H01L 21/26* (2006.01)
*H01L 21/42* (2006.01)

(52) U.S. Cl. .............................. 438/795; 257/E21.215; 257/E21.218

(58) Field of Classification Search ............... 437/710, 437/788, 795, 910, 928
See application file for complete search history.

(56) References Cited

U.S. PATENT DOCUMENTS 5,492,862 A * 2/1996 Misumi ....................... 438/516
6,703,317 B1 * 3/2004 Cheng et al. ............... 438/716
2003/0235994 A1 * 12/2003 Pan et al. .................... 438/710

FOREIGN PATENT DOCUMENTS

| JP | 7-106314 | 4/1995 |
| JP | 3170849 | 3/2001 |
| JP | 3227812 | 9/2001 |

* cited by examiner

Primary Examiner—Alexander Ghyka
(74) Attorney, Agent, or Firm—Wenderoth, Lind & Ponack, L.L.P.

(57) ABSTRACT

A Plasma processing method and apparatus exhibit excellent characteristics of reducing the amount of electric charge on a plasma-processed processing-object substrate and of preventing plasma damage and dielectric breakdown. Before the processing-object substrate is plasma-processed, top-and-bottom surfaces of the processing-object substrate are simultaneously subjected to a weak plasma in gas composed mainly of inert gas, which makes it possible to neutralize the charges on the processing-object substrate. The inert gas is any one of Ar, He, $N_2$, $H_2$, and vaporized $H_2O$ gas or a mixed gas of these gases.

8 Claims, 4 Drawing Sheets

PLASMA PROCESSING METHOD AND APPARATUS

BACKGROUND OF THE INVENTION

The present invention relates to a plasma processing method and apparatus which can be used for thin-film circuit formation methods in semiconductor and thin-film display industries thin-film circuit formation and, in particular, which allow transistor devices to be formed on such highly insulative substrates as glass, quartz, and compound semiconductors. The present invention also relates to a plasma processing method and apparatus capable of efficiently reducing occurrence of device damage and device breakage that otherwise might occur when a processing-object substrate, which has already been in a charge-stored state since before plasma processing, is subjected to plasma processing in such a charge-stored state.

In recent years, in thin-film device manufacturing fields, there has been a growing demand for process simplification and manufacturing-method modifications toward those which involve less environmental loads, from the viewpoints of manufacturing cost and environmental protection. Thus, there are desires for advancement from conventional engineering methods using chemicals toward engineering methods, as well as apparatuses, in which thin-film processing is performed by applying plasma.

However, such thin-film devices as shown above are manufactured through a wide variety of manufacturing steps, including, for example, a step of heat treatment, a step of water washing treatment, and a step using the plasma application. As a result of this, there are possibilities, at all times, of occurrence of electric charge storage on the top and bottom of the processing-object substrate from various factors.

Thin-film processing and apparatuses using the application of plasma, which include the steps of generating plasma in a vacuum, alienating process gas, and performing processing in combination of physical and chemical reactions by ions and radicals, would involve generation of much larger amounts of charges on the processing-object substrate.

With regard to the charges generated in large amounts, although a dielectric film for insulating metal films is formed as a thin film, involving a threshold value for withstanding voltage in terms of the structure of thin-film circuits, there are cases where if the processing-object substrate is charged and electrified with such charges at which the threshold value would be exceeded, a breakdown of the dielectric film would occur, making it impossible to make up a thin-film circuit. For this reason, it has conventionally been discussed and practiced to use a plasma that would be charged on the processing-object substrate as little as possible, or to reduce the given charges by devising plasma process measures.

Hereinbelow, a typical form of dry etching apparatus is explained with reference to FIG. 3.

Reference numeral 101 denotes a plasma processing vessel for performing a dry etching process, 101a denotes a process gas and inert-gas introducer, 102 denotes an electrode having functions of generating a plasma and serving for placing thereon a processing-object substrate (i.e., a substrate to be processed) 112, 103 denotes an evacuator, 104 denotes a vacuum transfer vessel for putting the processing-object substrate 112 into and out of the plasma processing vessel in a state of vacuum pressure, 104a denotes an evacuator, 104b denotes an inert-gas introducer, 105 denotes a gate door which serves as a partition wall between the plasma processing vessel 101 and the vacuum transfer vessel 104 and which has an opening/closing mechanism, 106 denotes a vacuum conveyance mechanism, 106a denotes a lift pin which is interlocked with the vacuum conveyance mechanism 106 and which operates for placing the processing-object substrate 112 onto the electrode 102, 107 denotes a load lock vessel capable of performing an operation of reducing the internal pressure of the vessel from atmospheric to vacuum state and, conversely, an operation of pressurizing the vessel from vacuum to atmospheric state, 107a denotes an evacuator, 107b denotes an inert-gas introducer, 108 denotes a gate door which serves as a partition wall between the vacuum transfer vessel 104 and the load lock vessel 107 in a vacuum state and which has an opening/closing mechanism, 109 denotes a gate door for holding the load lock vessel 107 in a vacuum state, 110 denotes a substrate storage device in which processing-object substrates 112 are stored, and 111 denotes an atmospheric conveyance mechanism for taking a processing-object substrate 112 out of the substrate storage device 110 and transferring the substrate 112 to the load lock vessel 107.

With respect to the dry etching apparatus constructed as shown above, its operation is explained below.

First, the processing-object substrate 112 (i.e., the substrate to be processed) is taken out of the substrate storage device 110 by the atmospheric conveyance mechanism 111, inert gas is purged from the inert-gas introducer 107b to the load lock vessel 107 to obtain an atmospheric state, the gate door 109 is opened, and the processing-object substrate 112 is transferred to the load lock vessel 107 by the atmospheric conveyance mechanism 111.

Subsequently, the gate door 109 is closed, and in the load lock vessel 107, the operation of the inert-gas introducer 107b is halted and the load lock vessel 107 is evacuated from the evacuator 107a. After the evacuation to a specified pressure is completed, the gate door 108 is opened. The vacuum transfer vessel 104 is normally held in a vacuum state by the evacuator 104a operating for evacuation at all times. The processing-object substrate 112 placed on the load lock vessel 107 is taken out by the vacuum conveyance mechanism 106 and transferred to the vacuum transfer vessel 104, and the gate door 108 is closed.

The evacuator 103 provided at the plasma processing vessel 101 normally performs the evacuation operation, so that the vessel 101 is normally held in the vacuum state. The gate door 105 is opened, and the processing-object substrate 112 present on the vacuum conveyance mechanism 106 within the vacuum transfer vessel 104 is transferred to the electrode 102 of the plasma processing vessel 101. After the processing-object substrate 112 is placed onto the lift pins 106a, the gate door 105 is closed, and the lift pins 106a move down so that the processing-object substrate is placed onto the electrode 102. After that, plasma processing is carried out.

Subsequent to completion of the plasma processing, after performing a process which is a so called charge-neutralizing process by such gas as $N_2$ or $O_2$ and which neutralizes or removes charges electrified on the processing-object substrate 112 by changing the plasma generation area by pressure or power, or during this process, the lift pins 106a move up, so that the processing-object substrate 112 is lifted.

Thereafter, the gate door 105 is opened, and the processing-object substrate 112 present on the lift pins 106a within the plasma processing vessel 101 is taken out of the plasma processing vessel 101 and transferred into the vacuum transfer vessel 104 by the vacuum conveyance mechanism 106.

In this case, the evacuator 103 of the plasma processing vessel 101 performs an evacuation operation so that the reaction product after the plasma processing does not flow into the vacuum transfer vessel 104. The gate door 105 is closed, then the gate door 108 is opened, the processing-object substrate 112 is transferred to the load lock vessel 107 by the vacuum conveyance mechanism 106, and the gate door 108 is closed. The evacuator 107a within the load lock vessel 107 is halted, and the inert gas is purged from the inert-gas introducer 107b, where the interior of the load lock vessel 107 is changed from vacuum pressure to an atmospheric pressure state. Then, the gate door 109 is opened, and the processing-object substrate 112 present in the load lock vessel 107 is taken out and stored into the substrate storage device 110 by the atmospheric conveyance mechanism 111 (see Japanese Unexamined Patent Publication No. 07-106314, and Japanese Patent Nos. 3227812, and 3170849).

However, the processes subsequent to the completion of the plasma processing of the processing-object substrate 112 in the plasma processing vessel 101 include the steps of, after completion of the charge-neutralizing process, opening the gate door 105, taking out the processing-object substrate 112 present on the electrode 102 within the plasma processing vessel 101 from within the plasma processing vessel 101, and then transferring the processing-object substrate 112 into the vacuum transfer vessel 104 by the vacuum conveyance mechanism 106. Thus, potential values of the residual charges remaining on the surface of the processing-object substrate 112 exhibit such behavior as shown in FIG. 4B.

The charges electrified on the surface of the processing-object substrate 112 after the plasma processing show the maximum potential value at the passage through the gate door 105. While still keeping a high voltage state thereafter, the processing-object substrate 112 is placed onto the vacuum transfer vessel 104. There is an issue, in this case, that dielectric breakdown may occur when the charging potential that varies during the transfer of the processing-object substrate 112 in the vacuum has exceeded a withstand voltage threshold 102a of the dielectric film formed on the processing-object substrate 112.

This breakdown is limited to cases where, as shown in FIG. 5, there exists a distance d that satisfies the following formula (Eq. 1) during the transfer of the processing-object substrate 112 in transitions from the charges of +Q at the surface of the electrode 102, as opposed to and polarized from the charges of −Q electrified on the surface of the processing-object substrate 112 (at this time point, the distance d between the rear face of the processing-object substrate 112 and the top surface of the electrode 102 is infinitely large so that the formula (Eq. 1) is not applicable), to the bottom face of the plasma processing vessel, to the bottom face of the gate door 105, and to the bottom face of the vacuum transfer vessel 104:

$$-Q = C_g \times V_g = \epsilon \times (S/d) \times V_g 1$$ (Eq. 1): Basic formula for capacitors, wherein $C_g$: capacitor capacity at the gap of distance d, $V_g$: potential difference at the gap of distance d, S: area, d: distance, $\epsilon$: dielectric constant. In FIG. 5, $V_{gmax}$ is a potential at the maximum gap at the distance d.

As can be understood from the above equation (Eq. 1), the reason (for the breakdown) could be attributed to the possibility that $V_g$ may increase upon arrival at a region (dmin) which is affected by d (distance).

Of course, it can easily be presumed that the surface potential of the processing-object substrate 112 increases to its largest level at the moment when the processing-object substrate 112 separates from the electrode 102. At this time point, a portion of the processing-object substrate 112 has passed through the gate door 105, so that even if occurrence of the dielectric breakdown is avoided, the surface potential can abnormally increase only at a portion of the processing-object substrate 112. On this basis, it is inferred that the dielectric breakdown can occur at that portion.

Also, without occurrence of the dielectric breakdown, a thin film bearing an active state, which is generally called damage, formed on the processing-object substrate 112, would cause the composition of the thin film interior to be changed along with local increases in the charges, thus creating a factor for deterioration in characteristics and performance of the thin film.

In common vacuum mass-production equipment, the gate door is manufactured as small as possible in order to reduce the pressure loss upon opening and closing of the gate door. At the point where the processing-object substrate 112 passes through the gate door 105, the distance between the processing-object substrate 112 and the gate door 105 becomes an extremely small one. In other words, the processing-object substrate 112 and the gate door 105 become infinitely close to each other at this point, and the distance d falls within a range subject to influences of the basic formula for electrostatic capacity. The potential $V_g$ in a portion of the processing-object substrate 112 shows a value higher than that on the electrode 102.

In conjunction with the above description, since there are no places where the accumulated charges are discharged as far as the processing-object substrate 112 is transferred in the vacuum, which makes the processing-object substrate 112 keep bearing charges at a very high level until coming to an atmospheric state, portions other than the gate door 105 can become more influenced by the equation (Eq. 1), depending on the configuration of mass-production equipment.

In view of these and other issues of the prior art, an object of the present invention is to provide a plasma processing method and apparatus capable of reducing the amount of charge on a processing-object substrate, which varies during transfer of the processing-object substrate subsequent to its plasma processing.

SUMMARY OF THE INVENTION

In order to achieve the above object, according to a first aspect of the present invention, there is provided a plasma processing method for forming, under a reduced pressure, a thin-film circuit on a processing-object substrate (i.e., a substrate to be processed) which is to be subjected to plasma processing, the method comprising:

before performing plasma processing on the processing-object substrate, subjecting the processing-object substrate to a charge-neutralization-use plasma in gas composed mainly of inert gas so that charges electrified on the processing-object substrate are neutralized.

According to a second aspect of the present invention, there is provided the plasma processing method as defined in the first aspect, wherein the inert gas is at least one gas selected from among Ar, He, $N_2$, $H_2$, and vaporized $H_2O$ gas.

According to a third aspect of the present invention, there is provided the plasma processing method as defined in the first or second aspect, wherein top and bottom surfaces of the processing-object substrate are simultaneously subjected to the plasma in the inert gas.

According to a fourth aspect of the present invention, there is provided a plasma processing apparatus comprising:

a vacuum vessel;

a first electrode for placing thereon a processing-object substrate (i.e., a substrate to be processed) which is to be subjected to plasma processing;

a lift pin for holding thereon the processing-object substrate and placing the substrate onto the first electrode;

a conveyance system for transferring the processing-object substrate to the lift pin;

a second electrode disposed so as to confront the first electrode;

an evacuator for evacuating the interior of the vacuum vessel;

a process-gas introducer for introducing process gas into the vacuum vessel;

a high-frequency power supply for, in a state in which the process gas is introduced into the vacuum vessel by the process-gas introducer while the interior of the vacuum vessel is evacuated by the evacuator, applying a high-frequency power to the first electrode so that a plasma is generated in the vacuum vessel;

an inert-gas introducer for introducing inert gas into the vacuum vessel before the processing-object substrate is subjected to plasma processing with the process gas introduced into the vacuum vessel by the process-gas introducer; and a control unit for, before execution of the plasma processing on the processing-object substrate, controlling the high-frequency power supply to generate an electrified charge-neutralization-use plasma in the inert gas.

According to a fifth aspect of the present invention, there is provided the plasma processing apparatus as defined in the fourth aspect, wherein the control unit controls operation of the lift pin so that before the placement of the processing-object substrate onto the first electrode, top-and-bottom surfaces of the processing-object substrate are simultaneously subjected to the electrified charge-neutralization-use plasma by the inert gas.

According to the present invention, there can be provided a plasma processing method and apparatus in which, before execution of the plasma processing on the processing-object substrate, the processing-object substrate is subjected to the charge-neutralization-use plasma composed mainly of inert gas so that initial charges electrified on the processing-object substrate are neutralized immediately before the plasma processing. As a result, the top-and-bottom surfaces of the processing-object substrate, as well as the top surface of the electrode, are made equal in potential to each other, thus making it possible to prevent plasma damage that otherwise could occur after the plasma processing.

Generally, it has never been conceived hitherto to perform plasma discharge before the plasma processing because of a possibility that reaction products or the like deposited on the wall surfaces of the plasma processing chamber might fly around to stick to the processing-object substrate, resulting in particle failures. However, in recent years, there has been a tendency that the rate of the particle failures is exceeded by the rate of failures that occur when the processing-object substrate, which has been charged during its transfer, is placed onto an electrode that has been charged at a different potential. Therefore, in the present invention, while reaction products or the like deposited on the wall surfaces of the plasma processing chamber are prevented from flying around as much as possible with a view to avoiding particle failures, a minimum necessary plasma is generated so that the top-and-bottom two surfaces of the processing-object substrate and the top surface of the electrode are made equal in potential to each other. In other words, by generating the minimum necessary plasma, i.e. a charge-neutralization-use plasma, that allows the top-and-bottom two surfaces of the processing-object substrate and the top surface of the electrode to be made equal in potential to each other, it becomes possible to more effectively prevent plasma damage that otherwise could occur after the plasma processing.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1A:
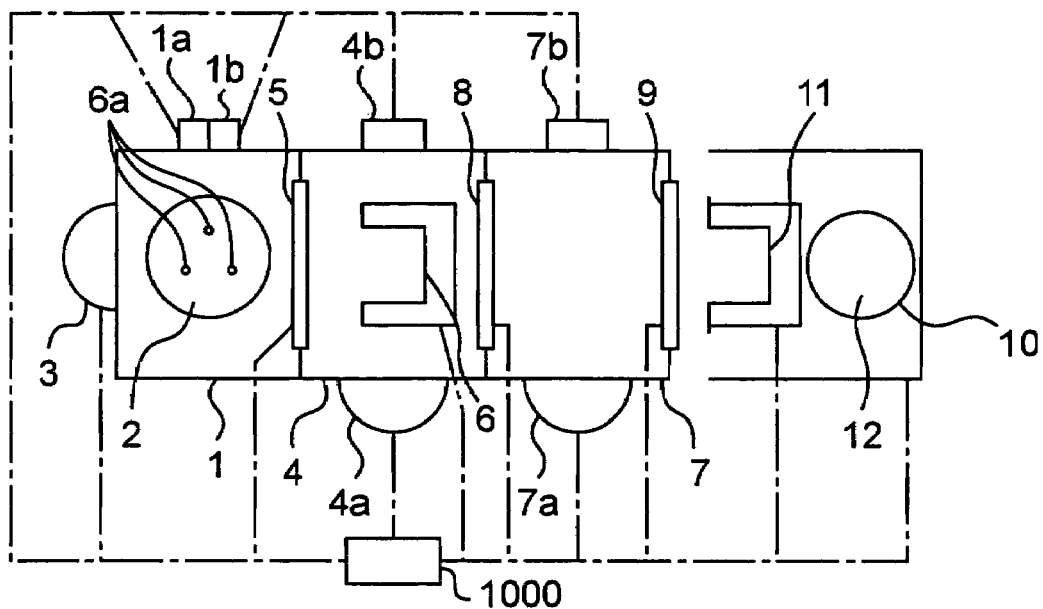
FIG. 1A is a plan view of an outlined configuration of a plasma processing apparatus according to a first embodiment of the present invention.

Before the description of the present invention proceeds, it is to be noted that like parts are designated by like reference numerals throughout the accompanying drawings.

Hereinbelow, embodiments of the present invention are described in detail with reference to the accompanying drawings.

A plasma processing method and apparatus according to a first embodiment of the present invention are explained with reference to the drawings.

Figure 1B:
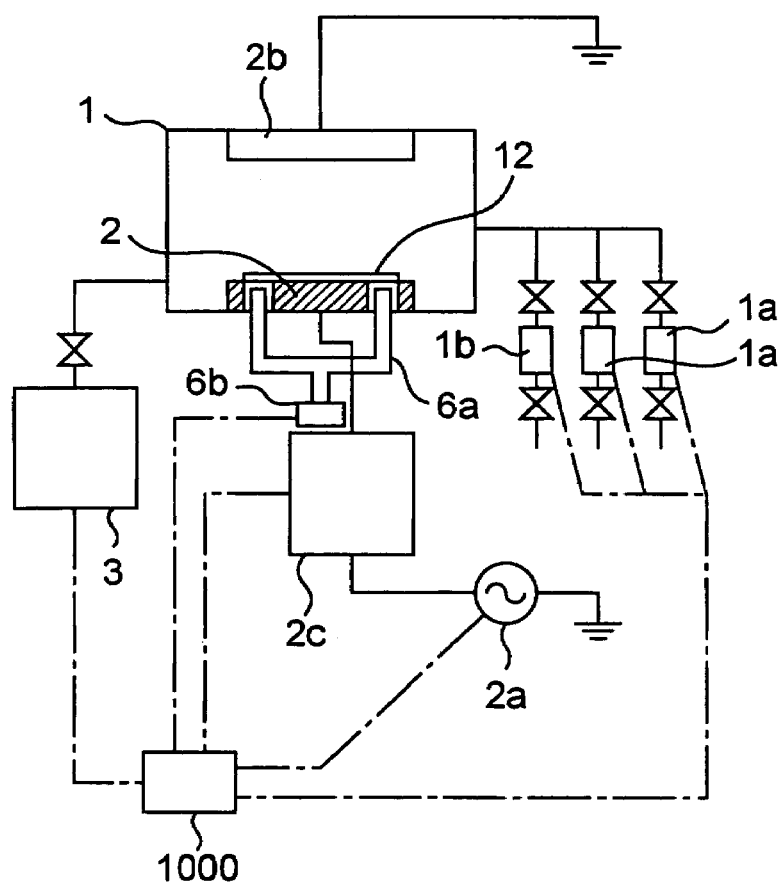
FIG. 1B is a side view of the outlined configuration of a plasma processing vessel of the plasma processing apparatus according to the first embodiment of the present invention.
Figure 2:
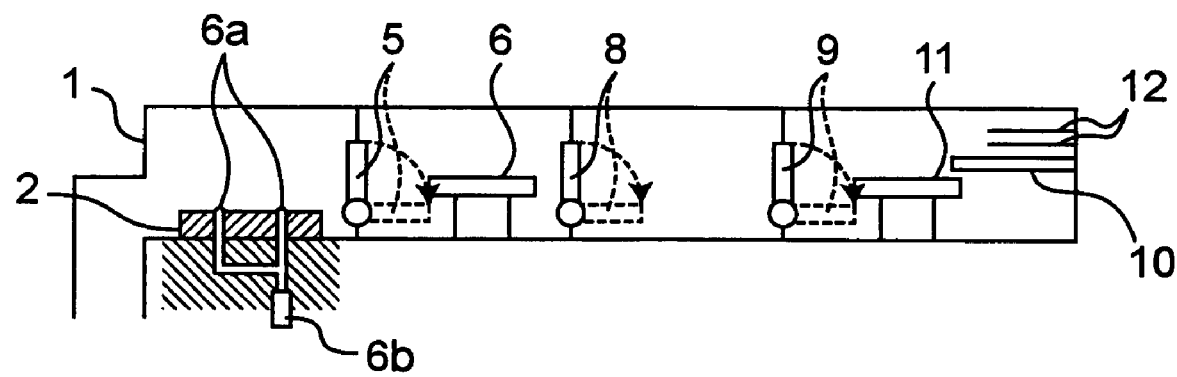
FIG. 2 is a side view of the outlined configuration of the plasma processing apparatus according to the first embodiment.
Figure 3:
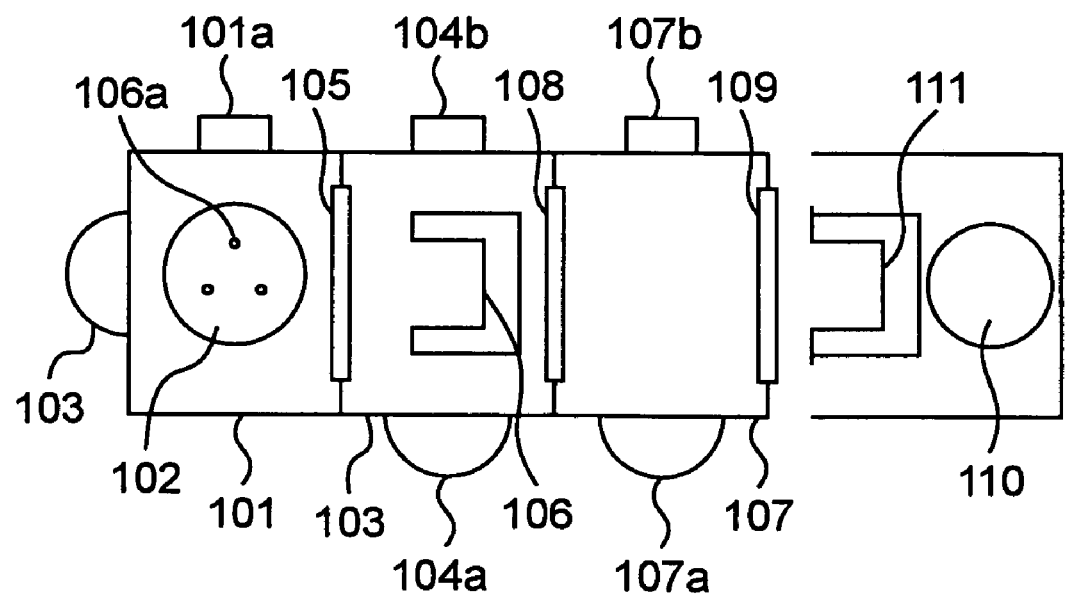
FIG. 3 is an outlined structural view of a conventional plasma processing apparatus.
Figure 4A:
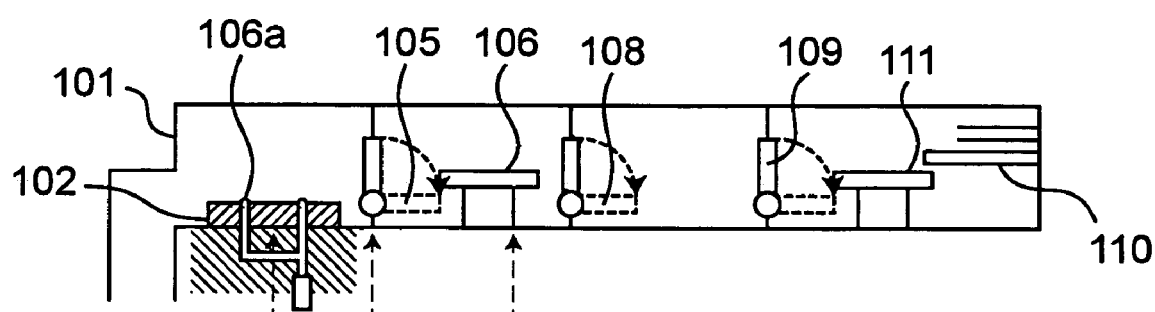
FIGS. 4A and 4B are, respectively, an outlined structural view of the conventional plasma processing apparatus and a graph showing the relationship between the position of the processing-object substrate and the surface charging value in the outlined structure of the conventional plasma processing apparatus.
Figure 4B:
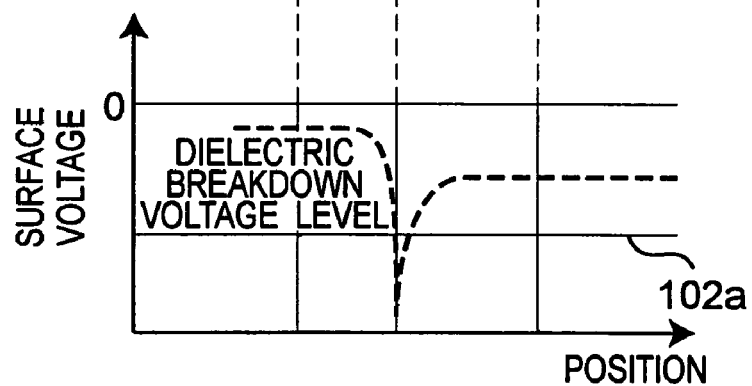
Figure 5:
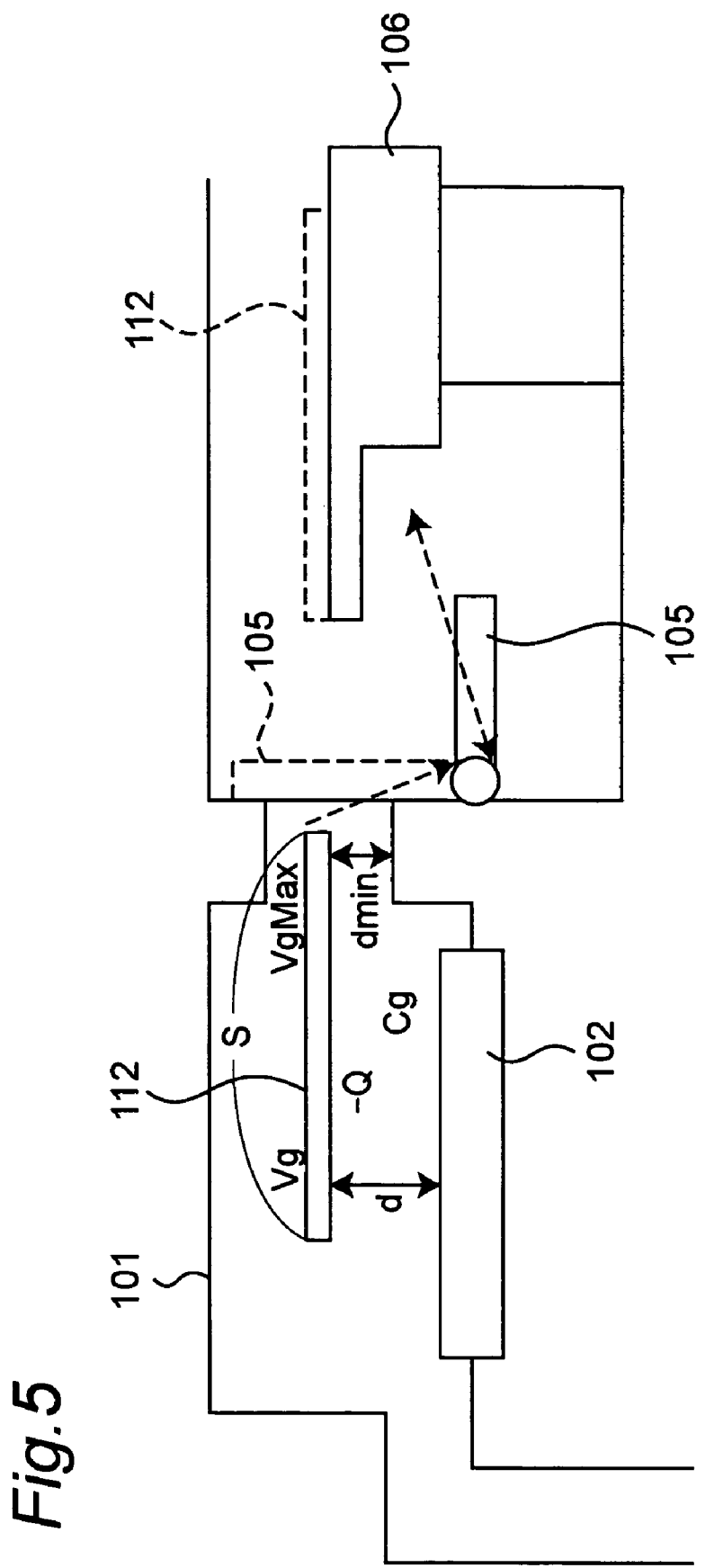
FIG. 5 is an outlined view of the mechanism indicating the increase of the surface potential (voltage) of the processing-object substrate.

Here are described a typical dry etching apparatus and method corresponding to the plasma processing method and apparatus of the first embodiment, which are explained with reference to FIGS. 1A and 1B and FIG. 2. Reference numeral 1 denotes a plasma processing vessel (one example of a plasma processing chamber) for dry etching, 1a denotes an inert-gas introducer (introducing device) for introducing inert gas into the plasma processing vessel 1 at the time of neutralization of electrified charges before plasma processing, and 1b denotes a process-gas introducer (introducing device) for introducing process gas into the plasma processing vessel 1 at the time of plasma processing. Also, numeral 2 denotes an electrode having a function of generating a plasma and supporting thereon a processing-object substrate (a substrate to be processed) 12 that is to be subjected to plasma processing, 2a denotes a high-frequency power supply, 2b denotes a grounded counter electrode, and 2c denotes a matching box which is an impedance matching circuit interposed between the high-frequency power supply 2a and the electrode 2. Further, numeral 3 denotes an evacuator (evacuating device) such as a pump for reducing the internal pressure of the plasma processing vessel 1, 4 denotes a vacuum transfer vessel (one example of a vacuum transfer chamber) provided adjacent to the plasma processing vessel 1 so as to allow the processing-object substrate 12 to be put into and taken out of the plasma processing vessel 1 in a vacuum pressure state, 4a denotes an evacuator (evacuating device) such as a pump for reducing the internal pressure of the vacuum transfer vessel 4 as with the plasma processing vessel 1, 4b denotes an $N_2$ gas introducer (introducing device) for introducing $N_2$ gas into the vacuum transfer vessel 4, 5 denotes a gate door which serves as a partition wall between the plasma processing vessel 1 and the vacuum transfer vessel 4, and which has an opening/closing mechanism for opening and closing the door 5, and 6 denotes a vacuum conveyance mechanism for conveying the processing-object substrate 12 between the plasma processing vessel 1 and the vacuum transfer vessel 4 which are both in a vacuum state. Also, 6a denotes lift pins which are used to separate the processing-object substrate 12 and the electrode 2 from each other in the plasma processing vessel 1, 6b denotes a lift pin up/down device such as a motor or an air cylinder for lifting and lowering all of the lift pins 6a, 7 denotes a load lock vessel (one example of load lock chamber) capable of performing an operation of reducing the internal pressure of the vessel from atmospheric to a vacuum state and, conversely, an operation of pressurizing the vessel from vacuum to atmospheric state, 7a denotes an evacuator (evacuating device) such as a pump for performing the above-mentioned pressure-reducing operation, and 7b denotes an $N_2$ gas introducer (introducing device). Further, 8 denotes a gate door which serves as a partition wall between the vacuum transfer vessel 4 and the load lock vessel 7, and which has an opening/closing mechanism for opening and closing the door 8, 9 denotes a gate door for maintaining the load lock vessel 7 in a vacuum state, and 10 denotes a substrate storage device in which processing-object substrates 12 are stored. Numeral 11 denotes an atmospheric conveyance mechanism such as a robot arm for taking a processing-object substrate 12 out of the substrate storage device 10 and transferring the substrate 12 to the load lock vessel 7. Also, numeral 1000 denotes a control unit for controlling operations of the inert-gas introducer 1a, the process-gas introducer 1b, the high-frequency power supply 2a, the matching box 2c, the evacuator 3, the evacuator 4a, the $N_2$ gas introducer 4b, the gate door 5, the vacuum conveyance mechanism 6, the lift pin up/down device 6b, the evacuator 7a, the $N_2$ gas introducer 7b, the gate door 8, the gate door 9, the substrate storage device 10, and the atmospheric conveyance mechanism 11, respectively.

With respect to the dry etching apparatus constructed as described above, its operation is explained below. The following operation is controlled by the control unit 1000.

First, the processing-object substrate 12 is taken out of the substrate storage device 10 by the atmospheric conveyance mechanism 11, $N_2$ gas is introduced from the inert-gas introducer 7b to the load lock vessel 7 to obtain an atmospheric state, the gate door 9 is opened, and the processing-object substrate 12 is conveyed to the load lock vessel 7 by the atmospheric conveyance mechanism 11. Subsequently, the gate door 9 is closed, and in the load lock vessel 7, the operation of the inert-gas introducer 7b is halted and the load lock vessel 7 is evacuated by the evacuator 7a. After the evacuation to a specified pressure is completed, the gate door 8 is opened.

The vacuum transfer vessel 4 is normally held in a vacuum state by the evacuator 4a operating for evacuation of vessel 4 at all times. The processing-object substrate 12 placed in the load lock vessel 7 is taken out by the vacuum conveyance mechanism 6 and is transferred to the vacuum transfer vessel 4, and the gate door 8 is closed. The evacuator 3 provided at the plasma processing vessel 1 is normally performing the evacuation operation, so that the interior of the plasma processing vessel 1 is normally held in the vacuum state. The gate door 5 is opened, the processing-object substrate 12 present on the vacuum conveyance mechanism 6 within the vacuum transfer vessel 4 is transferred onto the lift pins 6a of the plasma processing vessel 1, and the gate door 5 is then closed.

In the state in which the processing-object substrate 12 is held on the lift pins 6a, the inert gas is introduced from the inert-gas introducer 1a into the plasma processing vessel 1, and with a high-frequency power applied from the high-frequency power supply 2a to the electrode 2, there is generated an electrified charge-neutralization-use weak (faint) plasma which is generated in gas composed mainly of inert gas and which is of such a level that the processing-object substrate 12 will not be etched and that a thin film will not be formed thereon. That is, in this case where, with an inert gas such as $N_2$ gas introduced from the inert-gas introducer 1a, the interior of the plasma processing vessel 1 is adjusted to about 40 Pa by the evacuator 3, and with the application of a high-frequency power of 0.1 W/cm$^2$ from the high-frequency power supply 2a to the electrode 2, the electrified-charge-neutralization-use weak plasma is generated for five seconds. As a result, preprocessing charge neutralization on the top-and-bottom two surfaces of the processing-object substrate 12 and the top surface of the electrode 2 is performed so that the top-and-bottom two surfaces of the processing-object substrate 12 and the top surface of the electrode 2 are made equal in potential to each other. Thereafter, the lift pins 6a are lowered by driving the lift pin up/down device 6b, and the processing-object substrate 12 is placed onto the electrode 2. Then, the introduction of the inert gas from the inert-gas introducer 1a is halted, and meanwhile the process gas is introduced from the process-gas introducer 1b. Then a desired plasma processing is performed on a wafer of 8 inches as an example of the processing-object substrate 12 with a high-frequency power of, for example, 100 to 150 W/cm$^2$ applied from the high-frequency power supply 2a to the electrode 2. For the desired plasma processing, a chlorine-based gas is introduced as the process gas for metal-based thin films of the processing-object substrates 12, a fluorine-based gas is introduced as the process gas for the processing-object substrate 12 of silicon, and an oxygen-based gas is introduced as the process gas for plasma processing of a resist or similar portion of the processing-object substrate 12, where the desired plasma processing, such as etching, thin film formation, or resist removal, is performed.

It is noted here that the high-frequency power to be used for the generation of the weak plasma, which is generated in the gas composed mainly of inert gas and which is of such a level that the processing-object substrate 12 will not be etched and that a thin film will not be formed thereon, is preferably not more than 1/3 of the high-frequency power for the plasma processing, or 0.1 to 1.0 W/cm$^2$. The time duration of the high-frequency power is preferably not more than 10 seconds.

The inert gas is at least one selected from among Ar, He, $N_2$, $H_2$, and vaporized $H_2O$.

Without a limitation to the construction in which the lift pins 6a are lowered after execution of the pre-process charge neutralization of the processing-object substrate 12 and the electrode 2, the invention may also be constructed so that the lift pins 6a are lowered while the pre-process charge neutralization of the processing-object substrate 12 and the electrode 2 is being executed.

In cases where the above-described preprocessing by weak plasma was executed and not executed, charging potential values on the processing-object substrates 12 were measured in the plasma processing vessel 1 under a vacuum with a noncontact type surface potential electrometer. As a result, charges accumulated on the surface of the processing-object substrate 12 are as shown in Table 1.

TABLE 1

|  | Before desired plasma processing | After desired plasma processing |
| --- | --- | --- |
| Prior art (without pre-process charge neutralization by plasma) | Large variations (−tens of volts through +tens of volts) | −tens of volts through hundreds of volts (reducible to about −tens of volts by charge-neutralizing removing process, but damage involved) |
| Present invention (with pre-process charge neutralization by plasma) | Small variations (−a few volts through +a few volts) | −tens of volts |

Hitherto, it has been considered that plasma damage or dielectric breakdown would occur due to charges generated and given from the plasma during a desired plasma processing.

However, from the evaluation results on which the present invention is based, it can be considered that, due to the fact that charges electrified only on the top side of the processing-object substrate 12 are added as a result of the desired plasma processing to the charges that had been accumulated before the processing and that are present on top and bottom of the processing-object substrate 12, the balance of charges between the top and bottom of the processing-object substrate 12 is disturbed. This occurrence would adversely affect the devices on the thin-film circuit, thus causing the generation of plasma damage or dielectric breakdown.

The charges that the processing-object substrate 12 has had since early stages (i.e., prior to plasma processing) can be presumed to be charges due to heat treatment or water washing treatment during the preprocessing, or to frictional electrification during the transfer of the processing-object substrate 12 in the atmospheric air, as well as charges due to frictional electrification during the transfer from the substrate storage device 10 to the load lock vessel 7 and exhaustion from the atmospheric pressure to the vacuum state.

Accordingly, by performing the charge-neutralizing process as a pre-process on the top and bottom surfaces of the processing-object substrate 12 and the top surface of the electrode 2 at the same time with a weak plasma immediately before the desired plasma processing is performed, the charges on the top and bottom of the processing-object substrate 12 and the top surface of the electrode 2 are electrically eliminated so that the top-and-bottom two surfaces of the processing-object substrate 12 and the top surface of the electrode 2 are made equal in potential to each other. Thus, plasma damage that could occur after the plasma processing, such as occurrence of plasma damage or dielectric breakdown on the devices on the thin-film circuit, can effectively be prevented.

After the plasma processing, the lift pins 6a are lifted by the drive of the lift pin up/down device 6b, and the processing-object substrate 12 is separated from the electrode 2. Then, the gate door 5 is opened, and the processing-object substrate 12 present on the lift pins 6a in the plasma processing vessel 1 is taken out of the plasma processing vessel 1 and transferred into the vacuum transfer vessel 4 by the vacuum conveyance mechanism 6.

Further, the damage suppression effect is fulfilled to a greater extent by performing, after completion of the plasma processing, a process step of eliminating the charges electrified on the top-and-bottom two surfaces of the processing-object substrate 12 and the top surface of the electrode 2 in the charge-neutralizing process by such gas as $N_2$ or $O_2$.

Thereafter, the $N_2$ gas introducer 4b is halted, the gate door 5 is closed, the evacuator 4a is operated, the interior of the vacuum transfer vessel 4 is evacuated to a specified pressure or lower, and the interior of the plasma processing vessel 1 as well is evacuated to a specified pressure or lower by the evacuator 3. Subsequently, the gate door 8 is opened, the processing-object substrate 12 is transferred to the load lock vessel 7 by the vacuum conveyance mechanism 6, and the gate door 8 is closed. The evacuator 7a in the load lock vessel 7 is halted, the inert gas is introduced from the inert-gas introducer 7b, and the interior of the load lock vessel 7 is changed from vacuum pressure to atmospheric pressure state. Then, the gate door 9 is opened, and the processing-object substrate 12 present in the load lock vessel 7 is taken out and stored in the substrate storage 10 device by the atmospheric conveyance mechanism 11.

The embodiment of the present invention has been described with respect to a parallel-plate RIE plasma processing system. However, even if this system is replaced by such a plasma processing system as an ICP, an ECR, and a PE system, the same effects can be obtained.

Also when a processing vessel for exclusive use of preprocessing for generating the electrified charge-neutralization-use plasma is disposed independently with respect to the plasma processing vessel 1, or when the preprocessing is performed with such a vessel as the vacuum transfer vessel 4, the same effects can be obtained.

By properly combining arbitrary embodiments of the aforementioned various embodiments, the features provided by each of them can be made effectual.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of forming, under a reduced pressure, a thin-film circuit by applying a high-frequency power to an electrode for supporting a substrate to be subjected to plasma processing, said method comprising:

before performing said plasma processing on the substrate, simultaneously subjecting a top surface and a bottom surface of the substrate to a charge-neutralization plasma in gas mainly composed of an inert gas while the substrate is separated from the electrode, so that electric charges on the substrate are neutralized and so that the top surface and the bottom surface of the substrate are made substantially equal in potential.

2. The method of claim 1, wherein the inert gas comprises at least one gas selected from a group including Ar gas, He gas, $N_2$ gas, $H_2$ gas, and vaporized $H_2O$ gas.

3. The method of claim 1, wherein said simultaneously subjecting the top surface and the bottom surface of the substrate to charge-neutralization plasma comprises holding the substrate above the electrode by lifting pins so as to separate the substrate from the electrode during said simultaneous subjecting of the top surface and the bottom surface of the substrate to charge-neutralization plasma.

4. The method of claim 3, further comprising lowering the lifting pins so as to lower the substrate towards the electrode during said simultaneously subjecting the top surface and the bottom surface of the substrate to charge-neutralization plasma, while still holding the substrate above the electrode so as to separate the substrate from the electrode.

5. The method of claim 1, wherein said simultaneously subjecting the top surface and the bottom surface of the substrate to charge-neutralization plasma comprises applying the high-frequency power to the electrode to generate the charge-neutralization plasma at a level such that the substrate is not etched and such that a film is not formed on the substrate.

6. The method of claim 1, further comprising, after said simultaneously subjecting the top surface and the bottom surface of the substrate to a charge-neutralization plasma, stopping a flow of the inert gas into a chamber in which said plasma processing is to be performed, while introducing a process gas into the chamber.

7. The method of claim 1, wherein a level of the high-frequency power applied to the electrode during said simultaneously subjecting the top surface and the bottom surface of the substrate to a charge-neutralization plasma is no more than ⅓ a level of the high-frequency power applied to the electrode during said plasma processing.

8. The method of claim 1, wherein said simultaneously subjecting the top surface and the bottom surface of the substrate to charge-neutralization plasma and said plasma processing are performed in the same chamber.

* * * * *